(12) United States Patent
Hayakawa et al.

(10) Patent No.: US 9,140,762 B2
(45) Date of Patent: Sep. 22, 2015

(54) MOBILE ELECTRONIC DEVICE AND METHOD FOR CONTROLLING THE SAME

(75) Inventors: Takanobu Hayakawa, Kanagawa (JP); Akira Koyama, Kanagawa (JP); Masayoshi Nakajima, Kanagawa (JP)

(73) Assignee: KYOCERA Corporation, Kyoto (JP)

( * ) Notice: Subject to any disclaimer, the term of this patent is extended or adjusted under 35 U.S.C. 154(b) by 481 days.

(21) Appl. No.: 12/810,803

(22) PCT Filed: Dec. 26, 2008

(86) PCT No.: PCT/JP2008/073854
§ 371 (c)(1),
(2), (4) Date: Jun. 25, 2010

(87) PCT Pub. No.: WO2009/084685
PCT Pub. Date: Jul. 9, 2009

(65) Prior Publication Data
US 2010/0280776 A1 Nov. 4, 2010

(30) Foreign Application Priority Data
Dec. 27, 2007 (JP) .................. 2007-336660

(51) Int. Cl.
*G01R 31/36* (2006.01)
*H04M 1/02* (2006.01)

(52) U.S. Cl.
CPC ......... *G01R 31/3679* (2013.01); *H04M 1/0262* (2013.01)

(58) Field of Classification Search
CPC ...................... G01R 31/3648; G01R 31/3679
USPC ........................................... 702/63
See application file for complete search history.

(56) References Cited

U.S. PATENT DOCUMENTS 5,620,810 A * 4/1997 Golovin et al. ............... 429/317
5,780,992 A * 7/1998 Beard ........................... 320/106

(Continued)

FOREIGN PATENT DOCUMENTS

JP   H02-294231   5/1990
JP   H05-74501    3/1993

(Continued)

OTHER PUBLICATIONS

Office Action dated Jun. 5, 2012, issued in related U.S. Appl. No. 12/810,807.

*Primary Examiner* — Patrick Assouad
*Assistant Examiner* — Haidong Zhang
(74) *Attorney, Agent, or Firm* — Procopio, Cory, Hargreaves & Savitch LLP

(57) ABSTRACT

It is possible to provide a mobile electronic device which can accurately judge the service life of a cell even when the cell is replaced. Provided is also a method for controlling the mobile electronic device. A control block (48) includes: a voltage measurement unit (100) which is connected to a charge cell (32) and measures a voltage value of the charge cell (32); and a control unit (101) which performs control to measure a voltage of the charge cell (32) by the voltage measuring unit (100) upon each start and end of charge of the charge cell (32), stores in a storage unit (42), information on a number of charge/discharge times identified by the measured voltage value, and outputs information on the service life of the charge cell (32) according to the information on the number of charge/discharge times from an output unit (equivalent to a display (21) a speaker (45)).

14 Claims, 6 Drawing Sheets

(56) References Cited

U.S. PATENT DOCUMENTS

| | | | |
|---|---|---|---|
| 6,031,353 A * | 2/2000 | Banyas et al. | 320/112 |
| 6,512,984 B1 | 1/2003 | Suzuki | |
| 2002/0169572 A1* | 11/2002 | Suzuki et al. | 702/99 |
| 2004/0005497 A1* | 1/2004 | Nunomaki et al. | 429/92 |
| 2004/0196006 A1* | 10/2004 | Kawaguchi et al. | 320/132 |
| 2005/0001625 A1* | 1/2005 | Ashtiani et al. | 324/426 |
| 2005/0017685 A1* | 1/2005 | Rees et al. | 320/132 |
| 2005/0134217 A1* | 6/2005 | Sin | 320/114 |
| 2006/0164043 A1* | 7/2006 | Ukon | 320/162 |
| 2007/0013344 A1* | 1/2007 | Aradachi et al. | 320/132 |
| 2007/0072014 A1* | 3/2007 | Kim et al. | 429/7 |

FOREIGN PATENT DOCUMENTS

| | | |
|---|---|---|
| JP | 2000-260486 | 9/2000 |
| JP | 2002-34164 | 1/2002 |
| JP | 2004-264303 | 9/2004 |

* cited by examiner

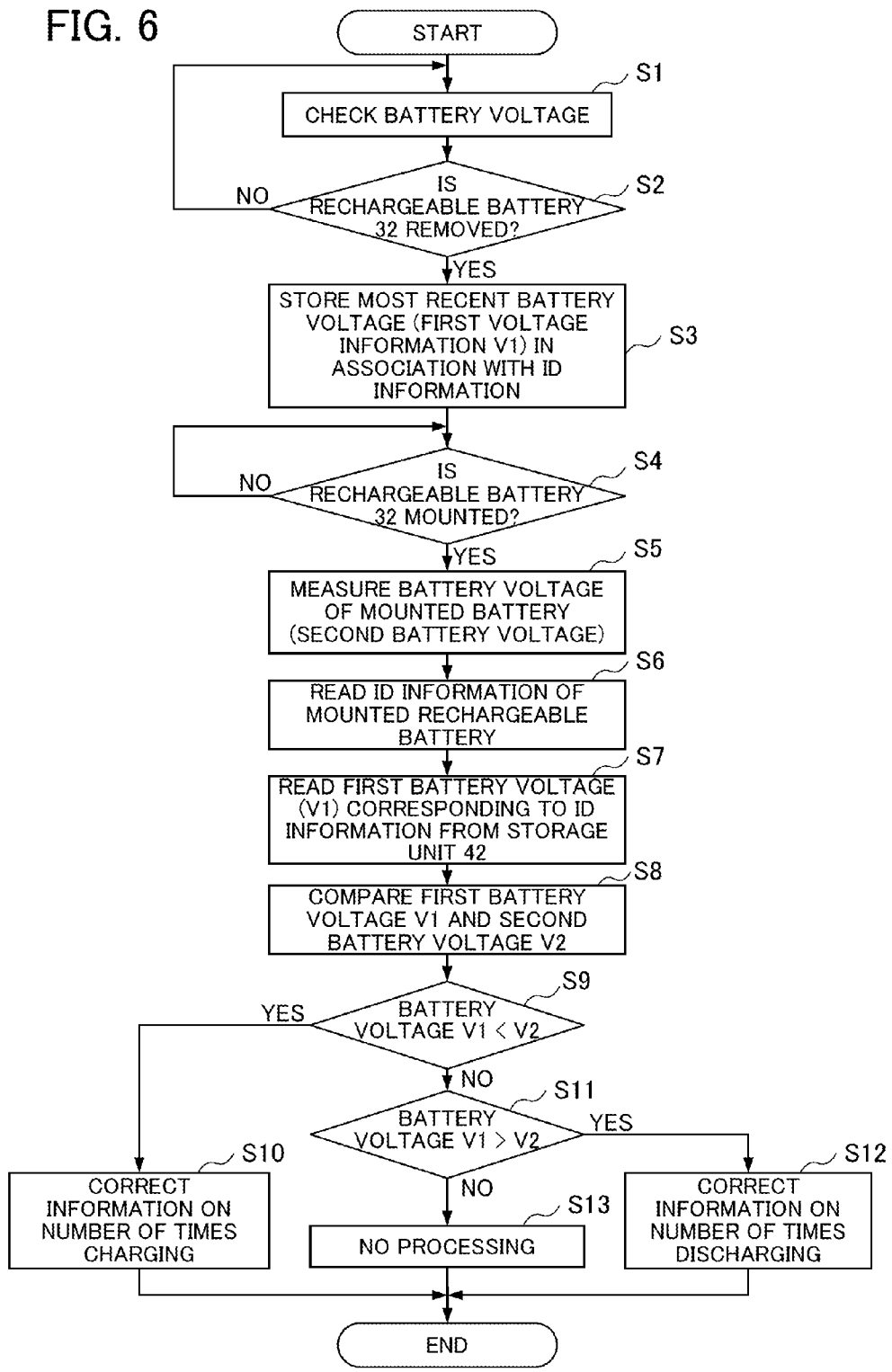

MOBILE ELECTRONIC DEVICE AND METHOD FOR CONTROLLING THE SAME

TECHNICAL FIELD

The present invention relates to a portable electronic device to which a rechargeable battery is mounted, and particularly relates to a portable electronic device that outputs a usage state of a rechargeable battery, and a method of controlling the same.

BACKGROUND ART

Although lithium ion batteries are the current mainstream of batteries for cellular phones, due to the ever-increasing trend toward smaller sizes, lighter weight and higher functionality of mobile terminal devices (such as for continuously viewing a digital television program, continuously playing music, browsing WEB sites, etc.), it is anticipated that the cycle of charging and discharging a battery will be accelerated, and as a result, the life of a battery will tend to be shortened relative to the period of use of a mobile terminal device.

Here, methods of detecting the life of a battery include a method in which the life of a battery is determined by way of a change in an impedance value of the battery (for example, see Patent Document 1), and a method in which a function regarding a charging/discharging curve is stored in advance, and the life of a battery is determined by calculating and weighting a deterioration value when charging and discharging (for example, see Patent Document 2).

Moreover, in general, the life of a battery is defined by each battery manufacturer, and refers to a state in which the capacitance has been decreased to about 50 to 60% of the initial capacitance due to, for example, about 500 to 600 times charging and discharging. In addition, beyond this state, the expected operation of the mobile terminal device cannot be guaranteed due to an increase of internal resistance, etc.

Therefore, it is necessary to accurately and clearly output the life of a battery to the user in order to guarantee expected operations of the mobile terminal device.

Patent Document 1: Japanese Unexamined Patent Application, First Publication No. H05-74501

Patent Document 2: Japanese Unexamined Patent Application, First Publication No. 2004-264303

DISCLOSURE OF THE INVENTION

Problems to be Solved by the Invention

Incidentally, since a battery can be removed from and mounted to a mobile terminal device, it is difficult to determine a life state of the battery in a case in which the battery has been replaced.

The present invention has been made in view of the aforementioned problem, and an object thereof is to provide a portable electronic device and a method for controlling the same, which are capable of accurately determining the life of a battery even in a case in which the battery has been replaced, etc., by way of a simple configuration without increasing the cost.

Means for Solving the Problems

In order to solve the abovementioned problem, a portable electronic device according to the present invention is characterized by including: a storage unit; a voltage measuring unit that measures, each time charging of the rechargeable battery is started or completed, a voltage of a rechargeable battery; and a control unit that performs control such that information on a number of times charging identified based on a voltage value measured via the voltage measuring unit is stored in the storage unit, in which the storage unit is configured such that, while the rechargeable battery is mounted, a voltage of the rechargeable battery is stored as first voltage information while being updated, and even if the rechargeable battery is removed, the information on the number of times charging and the first voltage information thus stored are retained; when the rechargeable battery is mounted, the voltage measuring unit measures a voltage of the rechargeable battery when mounted as second voltage information; and when the rechargeable battery is mounted, the control unit compares the first voltage information and the second voltage information, and in a case in which values thereof are different from each other, corrects the information on the number of times charging.

Moreover, in the portable electronic device, it is preferable that the control unit measures, each time charging of the rechargeable battery is completed, a voltage of the rechargeable battery via the voltage measuring unit.

In addition, in the portable electronic device, it is preferable that the control unit measures, each time charging of the rechargeable battery is started, a voltage of the rechargeable battery via the voltage measuring unit.

Furthermore, in the portable electronic device, it is preferable that the storage unit separately manages a value related to charging and a value related to discharging as the information on the number of times charging, and when the rechargeable battery is mounted, in a case in which the control unit determines that the second voltage information is higher than the first voltage information, the control unit performs correction such that the value related to charging is added to the information on the number of times charging.

Moreover, in the portable electronic device, it is preferable that, when the rechargeable battery is mounted, in a case in which the control unit determines that the first voltage information is higher than the second voltage information, the control unit performs correction such that the value related to discharging is added to the information on the number of times charging.

In addition, in the portable electronic device, it is preferable that the storage unit stores a weighting value that is different for each voltage value, and each time charging of the rechargeable battery is started or completed, the control unit extracts from the storage unit a weighting value corresponding to a voltage value of the rechargeable battery measured by the voltage measuring unit, and sequentially adds the weighting value thus extracted to identify the information on the number of times charging.

Furthermore, in the portable electronic device, it is preferable that, when the rechargeable battery is mounted, the control unit compares the first voltage information and the second voltage information, and in a case in which values thereof are different from each other, the control unit extracts a weighting value corresponding to the second voltage information from the storage unit, and performs correction such that the extracted weighting value is added to the information on the number of times charging retained in the storage unit.

Moreover, in the portable electronic device, it is preferable that the rechargeable battery has unique ID information, and the storage unit retains the information on the number of times charging and the first voltage information for each rechargeable battery based on the ID information.

In addition, in the portable electronic device, it is preferable that, when the rechargeable battery is mounted, the control unit confirms ID information of the rechargeable battery, searches the storage unit for ID information corresponding to the rechargeable battery, and compares the first voltage information corresponding to the searched ID information and the second voltage information of the rechargeable battery mounted, and in a case in which values thereof are different from each other, corrects information on a number of times charging corresponding to the searched ID information.

Furthermore, it is preferable that the portable electronic device further includes an output unit that outputs a variety of information, in which the control unit performs control such that the output unit outputs information on life of a mounted rechargeable battery while mounted, based on information on a number of times charging stored in the storage unit.

Moreover, in the portable electronic device, it is preferable that the storage unit stores a predetermined value for indicating that the life of the rechargeable battery has reached an end, and the control unit identifies information on the life, based on a remaining level in the information on the number of times charging relative to the predetermined value.

In addition, in the portable electronic device, it is preferable that the control unit identifies information on the life as a remaining number of times for which charging is possible.

Furthermore, in the portable electronic device, it is preferable that the rechargeable battery has unique ID information, and the storage unit retains the information on the number of times charging and the first voltage information for each rechargeable battery based on the ID information.

Moreover, in the portable electronic device, it is preferable that, when the rechargeable battery is mounted, the control unit confirms ID information of the rechargeable battery, searches the storage unit for ID information corresponding to the rechargeable battery, and compares the first voltage information corresponding to the searched ID information and the second voltage information of the rechargeable battery mounted, and in a case in which values thereof are different from each other, the control unit corrects information on a number of times charging corresponding to the searched ID information.

In addition, it is preferable that the portable electronic device further includes an output unit that outputs a variety of information, in which the control unit performs control such that the output unit outputs information on life of a mounted rechargeable battery while mounted, based on the information on the number of times charging stored in the storage unit.

Furthermore, in the portable electronic device, it is preferable that the storage unit stores a predetermined value for indicating that the life of the rechargeable battery has reached an end, and the control unit identifies information on the life, based on a remaining level in the information on the number of times charging relative to the predetermined value.

Moreover, in the portable electronic device, it is preferable that the control unit identifies information on the life as a remaining number of times for which charging is possible.

In order to solve the abovementioned problem, in a method of controlling a portable electronic device according to the present invention, in which a rechargeable battery can be mounted thereto and removed therefrom, and which includes a storage unit configured so as to retain at least a part of information stored even if the rechargeable battery is removed, in which the method is characterized by including the steps of: measuring, each time charging of the rechargeable battery occurs, a voltage of a rechargeable battery mounted; identifying information on a number of times charging based on a value of the voltage measured; storing the information on the number of times charging identified in the storage unit; updating and storing a voltage of the rechargeable battery as first voltage information in the storage unit while the rechargeable battery is mounted; measuring a voltage of the rechargeable battery when mounted as second voltage information when the rechargeable battery is mounted; comparing the first voltage information stored and the second voltage information when the rechargeable battery is mounted; and correcting the information on the number of times charging stored in a case in which the second voltage information is different from the first voltage information.

Effects of the Invention

According to the present invention, the life of a battery can be accurately determined even in a case in which the battery has been replaced.

BRIEF DESCRIPTION OF THE DRAWINGS

FIG. 6 is a flowchart illustrating a method of determining battery life.

Figure 1:
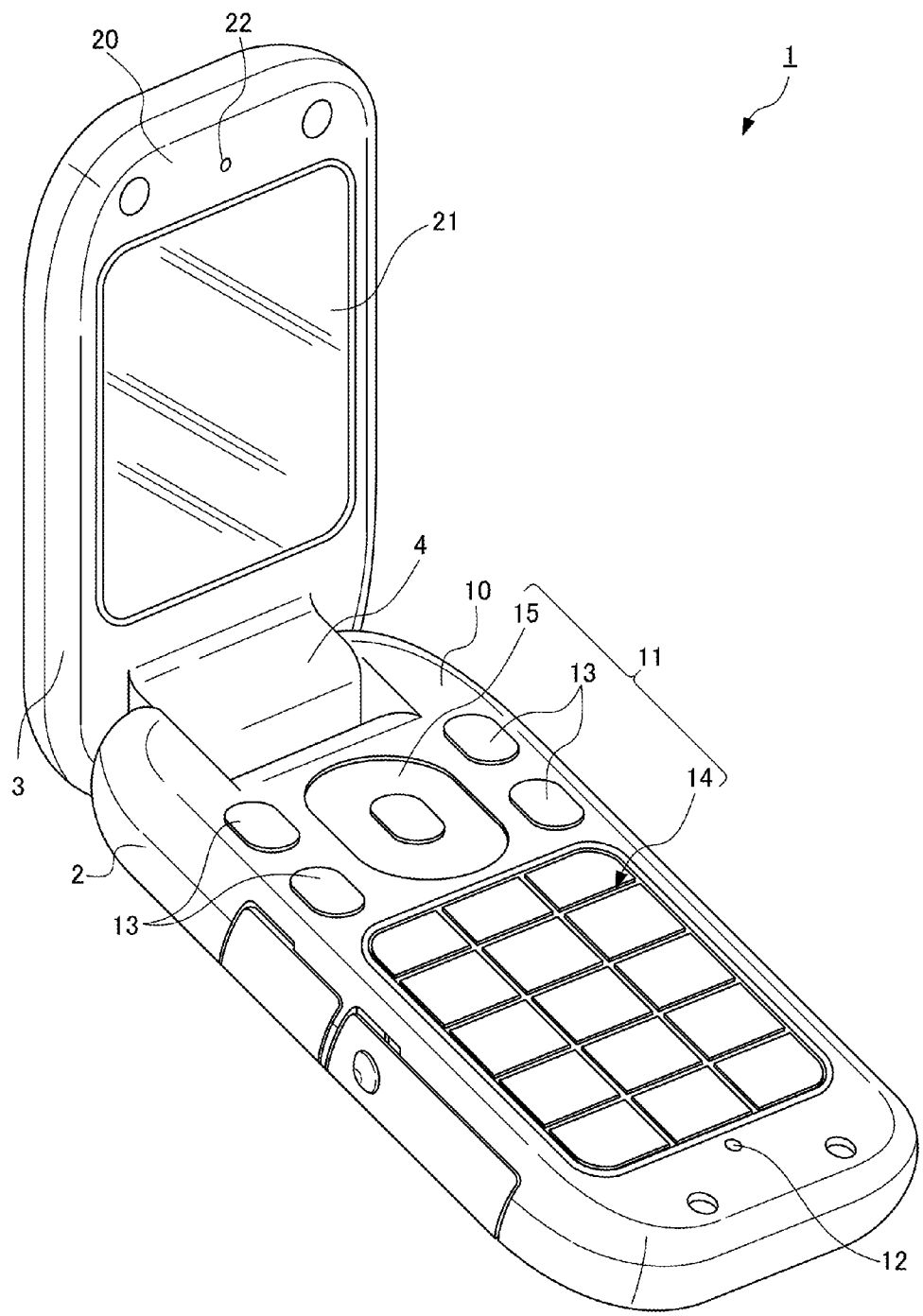
FIG. 1 is a perspective view showing an appearance of a cellular telephone device according to the present invention.

EXPLANATION OF REFERENCE NUMERALS 1 cellular telephone device
21 display (output unit)
32 rechargeable battery
42 storage unit
45 speaker (output unit)
48 control block
100 voltage measuring unit
101 control unit

PREFERRED MODE FOR CARRYING OUT THE INVENTION

A description is provided hereinafter regarding an embodiment of the present invention.

FIG. 1 is a perspective view showing an appearance of a cellular telephone device 1 as an example of a portable electronic device according to the present invention. It should be noted that, although a cellular telephone device is described hereinafter, the present invention is not limited thereto, and may be a PHS (Personal Handyphone System), a PDA (Personal Digital Assistant), a portable navigation device, a notebook PC or the like.

The cellular telephone device 1 is configured to include an operation unit side body 2 and a display unit side body 3. The operation unit side body 2 is configured to include on a front face 10 thereof an operation button set 11 and a microphone 12 to which sounds, which a user of the cellular telephone device 1 produces during a phone call, are input. The operation key set 11 includes: feature setting operation buttons 13 for operating various settings and various features such as a telephone number directory feature and a mail feature; input operation buttons 14 for inputting digits of a telephone number and characters for mail; and a selection operation button 15 that performs selection of the various operations and scrolling.

The display unit side body 3 is configured to include, on a front face portion 20, a display 21 for displaying a variety of information, and a sound output unit 22 for outputting sound of the other party of the conversation.

An upper end portion of the operation unit side body 2 and a lower end portion of the display unit side body 3 are connected via a hinge mechanism 4. The cellular telephone device 1 can be in a state where the operation unit side body 2 and the display unit side body 3 are apart from each other (opened state), and in a state where the operation unit side body 2 and the display unit side body 3 are contacting each other (folded state), as the operation unit side body 2 and the display unit side body 3, connected via the hinge mechanism 4, pivot with respect to each other.

It should be noted that, although FIG. 1 shows a so-called flip-type cellular telephone device, the present invention is not limited thereto, and the cellular telephone device 1 may be of: a slider type in which one body slides to one direction from a state in which the operation unit side body 2 and the display unit side body 3 are mutually superimposed; or a rotating type (turning type) in which one body is rotated around an axis line along the direction in which the operation unit side body 2 and the display unit side body 3 are superimposed.

Figure 2:
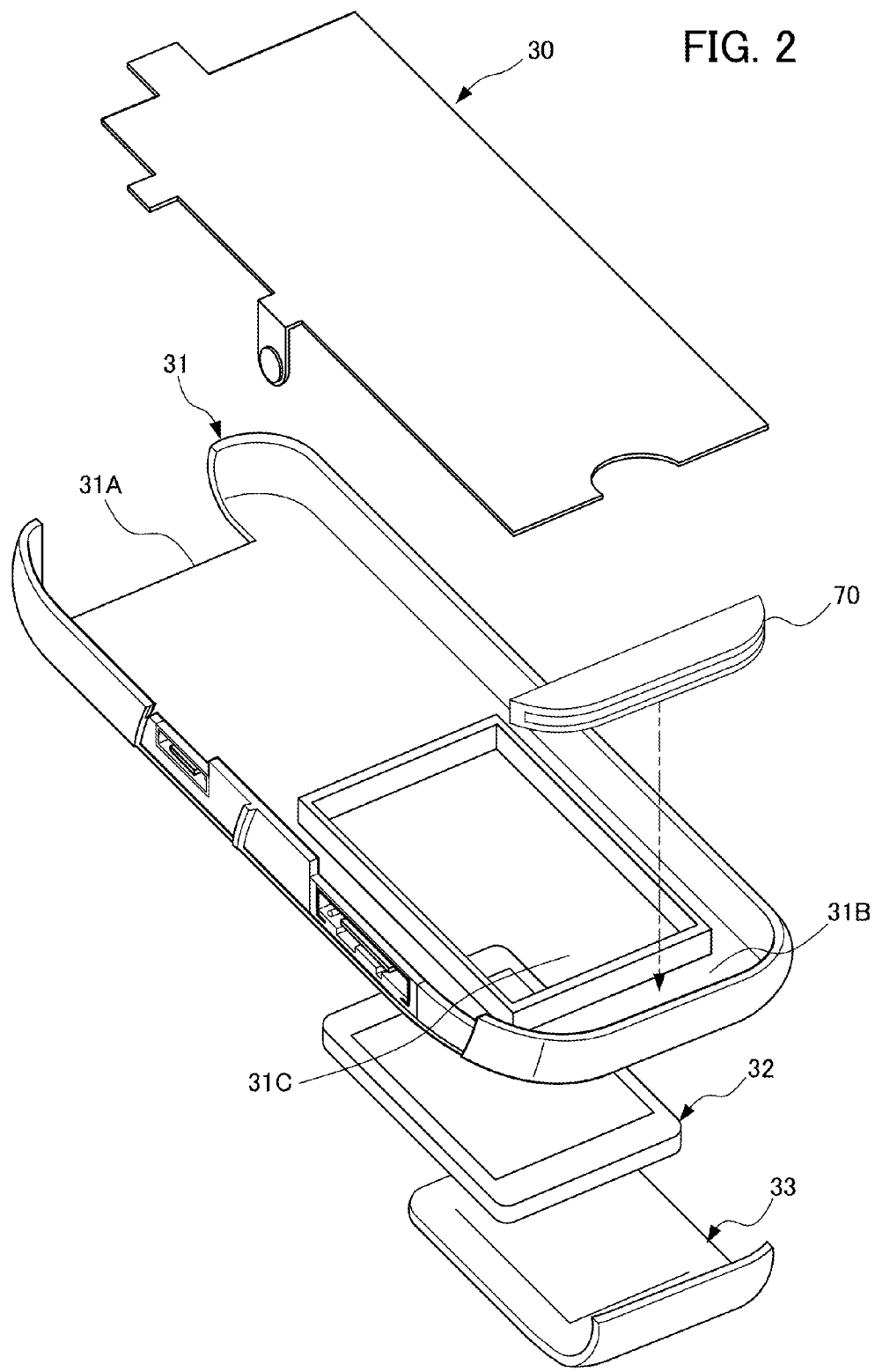
FIG. 2 is a perspective view showing a configuration of an operation unit side body included in the cellular telephone device according to the present invention.

In addition, FIG. 2 is an exploded perspective view of a part of the operating unit side body 2. As shown in FIG. 2, the operation unit side body 2 is composed of a circuit board 30, a rear case portion 31, a rechargeable battery 32 that is a rechargeable cell, and a rechargeable-battery cover 33.

On the circuit board 30, an element such as a CPU (corresponding to a control block 48 to be described later) that performs predetermined arithmetic processing is mounted, and a predetermined signal is transmitted to the CPU when the user operates the operation key set 11 on the front portion 10. Moreover, battery terminals 46 to be described later are mounted on the circuit board 30.

The rear case portion 31 includes: a hinge mechanism fixing portion 31A that fixes the hinge mechanism 4; a main antenna housing portion 31B that houses a main antenna 70 which communicates using a predetermined usable frequency band; and a rechargeable-battery housing portion 31C that houses the rechargeable battery 32.

Figure 3:
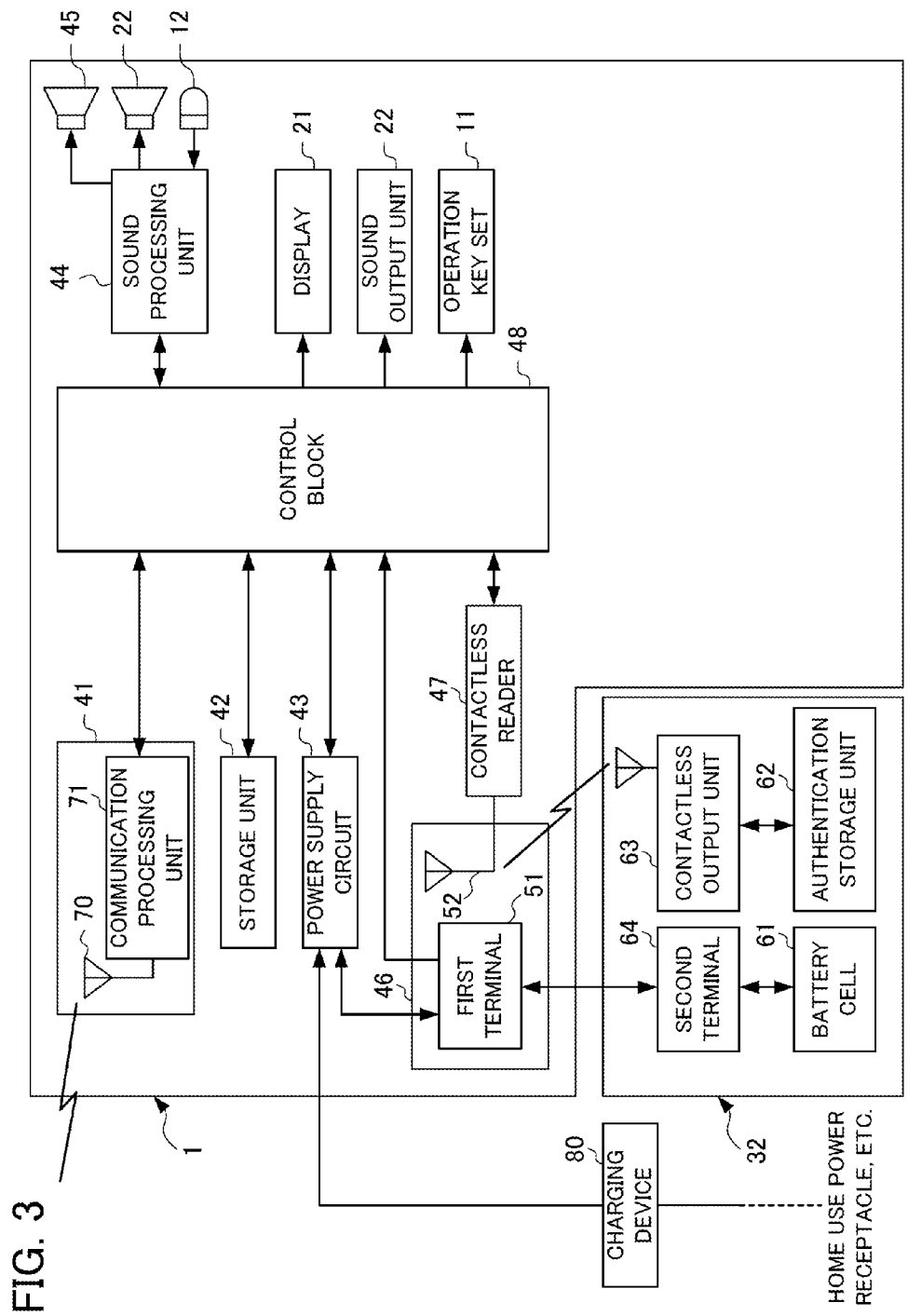
FIG. 3 is a block diagram showing functions of the cellular telephone device according to the present invention.

FIG. 3 is a functional block diagram showing functions of the cellular telephone device 1. As shown in FIG. 3, the cellular telephone device 1 includes the operation key set 11, the microphone 12, the display 21, the sound output unit 22, a communication unit 41, a storage unit 42, a power supply circuit 43, a sound processing unit 44, a speaker 45, the battery terminals 46, a contactless reader 47, and the control block 48 that controls each unit. It should be noted that the battery terminals 46 include a first terminal 51 and an RFID antenna 52 connected to the contactless reader 47. Furthermore, the rechargeable battery 32 includes a battery cell 61, an authentication storage unit 62, a contactless output unit 63, and a second terminal 64.

Moreover, when the cellular telephone device 1 is placed on a predetermined charging device 80 compatible with the cellular telephone device 1, connecting terminals of the charging device 80 and those of the power supply circuit 43 come in contact with each other, the connecting terminals being compatible with each other, and a circuit connection is established, thereby charging the battery cell 61 of the rechargeable battery 32.

In other words, a charging circuit that establishes a circuit connection between the charging device 80 and the rechargeable battery 32 is formed in a portion of the power supply circuit 43. Moreover, the power supply circuit 43 is configured such that an ON state and an OFF state of a power supply operation from the charging device 80 to the rechargeable battery 32 can be switched, which is performed by the charging circuit based on an instruction from the control block 48.

The communication unit 41 includes: the main antenna 70 that communicates with external devices via a predetermined usable frequency band; and a communication processing unit 71 that performs signal processing such as modulation processing or demodulation processing. In addition, the communication unit 41 is supplied with a power supply voltage from the rechargeable battery 32 via the power supply circuit 43. Furthermore, similarly to a general cellular telephone device, the communication unit 41 can be connected to a public communication network via a nearest base station, for example, by radio communication such as of a CDMA2000_1x method.

The storage unit 42 is nonvolatile memory media, and ID information on a plurality of rechargeable batteries together with information on each operating condition is stored therein. Moreover, it is assumed that the configuration is made such that the contents stored in the storage unit 42 cannot be rewritten by the user.

The power supply circuit 43 converts a power supply voltage, which is supplied from the rechargeable battery 32, into a predetermined voltage, and supplies the converted voltage to each portion of the cellular telephone device 1.

The sound processing unit 44 is controlled by the control block 48, and outputs sound of the other party of the conversation from the sound output unit 22. In addition, the sound processing unit 44 performs signal processing on the user's voice that is input from the microphone 12. Furthermore, the sound processing unit 44 performs, for example, reproduction processing of music data stored in the storage unit 42 to be output from the speaker 45.

The first terminal 51 is connected to the second terminal 64 of the rechargeable battery 32, and supplies a power supply voltage, which is supplied from the battery cell 61, to the power supply circuit 43.

Moreover, as shown in FIG. 3, in the rechargeable battery 32, a circuit connection is established such that the authentication storage unit 62 and the contactless output unit 63 are connected to each other. In addition, the authentication storage unit 62 stores unique ID information for identifying a rechargeable battery. More specifically, the authentication storage unit 62 is configured such that a data area sandwiched between a start bit and a stop bit is provided, and serial data including a parity bit for error correction can be further stored therein. Moreover, as ID information, the data area stores in a serial sequence: ID information that is unique to a rechargeable battery, such as a serial number of the rechargeable battery 32; type information on the rechargeable battery, such as lithium-ion type, nickel-hydride type, or nickel-cadmium type; and information such as manufacturer classification, capacitance value, etc.

Figure 4:
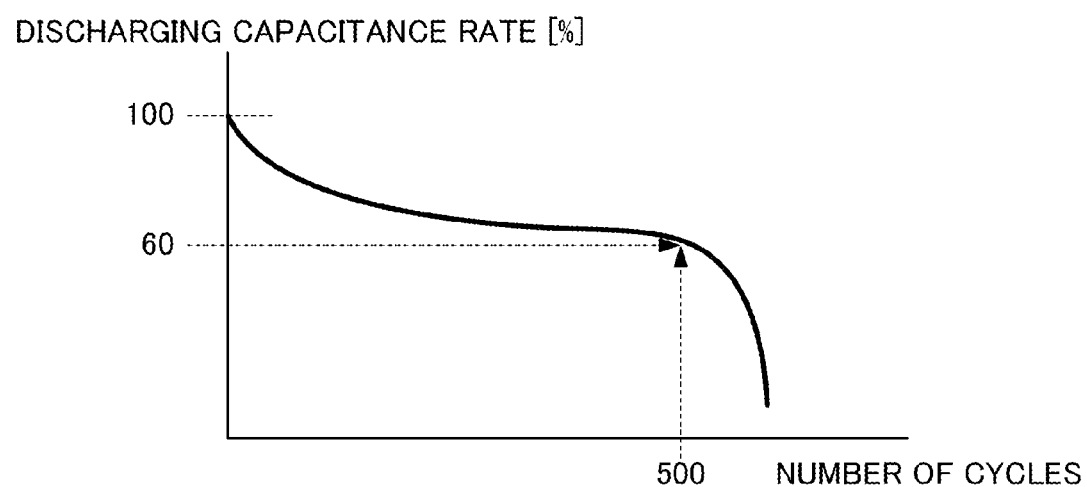
FIG. 4 is graph showing a relationship between a number of cycles and a discharging capacitance rate of a rechargeable battery.

Here, characteristics of the rechargeable battery 32 are described. For example, in a case in which the rechargeable battery 32 is a lithium ion battery, generally, the capacitance is decreased to approximately around 60% due to approximately around 500 cycles of charging/discharging operations. Moreover, a state in which the capacitance is decreased to approximately around 60% is referred to as a state in which the life of the rechargeable battery has reached an end. It should be noted that the rechargeable battery 32 is still usable even in the state in which the life of the rechargeable battery has reached the end; however, in such a state, the impedance has also increased, and thus it is difficult to achieve the desired performance. In addition, after the capacitance has fallen below approximately 60%, the capacitance will decrease at an accelerated pace (see FIG. 4).

Therefore, it is desirable to count the number of times the rechargeable battery has been charged and discharged, and to output the life of the rechargeable battery to the user in accordance with the count; however, in a case in which the battery has been replaced, the life of the battery cannot be continuously measured, and thus it is difficult to accurately determine the life of the battery. For example, the rechargeable battery is removed from the cellular telephone device, and the rechargeable battery is charged by using a special charging device or the like. Then, in a case in which the rechargeable battery is subsequently mounted to the cellular telephone device again, although the cycle number itself of charging the rechargeable battery 32 has been updated, such update information does not remain in the rechargeable battery 32. Therefore, it is difficult to determine an accurate charging life. Accordingly, in the present invention, a configuration and method are proposed, which are capable of accurately determining the life of a battery even in a case in which the battery has been replaced, etc., by way of a simple configuration without increasing the cost.

Furthermore, the contactless reader 47 can perform contactless-type (radio) communication with the contactless output unit 63 via the RFID antenna 52 in accordance with control of the control block 48 by using an RFID (Radio Frequency Identification) technique, and read ID information stored in the authentication storage unit 62 of the rechargeable battery 32.

In other words, even in a case in which the rechargeable battery 32 is mounted to the cellular telephone device 1, and a direct circuit connection is not established between the contactless reader 47 and the contactless output unit 63, upon detecting that the rechargeable battery 32 is mounted, the control block 48 is firstly activated in a background (not accompanied with display or sound), and the contactless reader 47 starts radio transmission of an authentication request based on an instruction of the control block 48. Moreover, the contactless output unit 63 receives an authentication request signal from the contactless reader 47, thereby generating operating power by electromagnetic induction, without being supplied with power from the battery cell 61 in the rechargeable battery 32. In addition, the contactless output unit 63 reads ID information stored in the authentication storage unit 62 by using the operating power as a power supply, and wirelessly outputs the ID information to the contactless reader 47.

Figure 5:
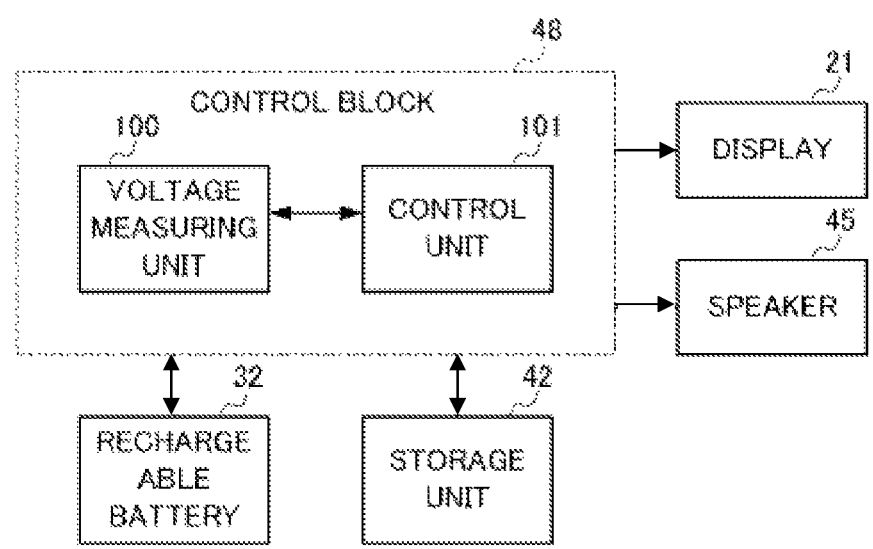
FIG. 5 is a block diagram showing a configuration of a control block.

Next, a configuration of the control block 48 is described. As shown in FIG. 5, the control block 48 includes a voltage measuring unit 100 and a control unit 101. The voltage measuring unit 100 is connected to the rechargeable battery 32, and measures a voltage value of the rechargeable battery 32. Each time charging of the rechargeable battery 32 is started or completed, the control unit 101 measures a voltage of the rechargeable battery 32 via the voltage measuring unit 100, and stores information on the number of times charging and discharging, which has been identified based on the measured voltage value, in the storage unit 42. In addition, the control unit 101 performs control such that information on the life of the rechargeable battery 32 is output via the output unit (corresponding to the display 21 and the speaker 45) based on the information on the number of times charging and discharging.

In a case in which the rechargeable battery 32 is mounted, a voltage of the rechargeable battery 32 is stored in the storage unit 42, while being updated as first voltage information V1 that is monitored by the voltage measuring unit 100. Furthermore, the storage unit 42 is configured such that the information on the number of times charging and discharging and the first voltage information V1 thus stored are retained, even in a case in which the rechargeable battery 32 is removed.

Moreover, when the rechargeable battery 32 is mounted, the voltage measuring unit 100 measures a voltage of the rechargeable battery 32 when mounted as second voltage information V2.

In addition, when the rechargeable battery 32 is mounted, the control unit 101 compares the first voltage information V1 and the second voltage information V2, and if the values thereof are different from each other, corrects the information on the number of times charging and discharging.

With such a configuration, even in a case in which the rechargeable battery has been replaced, etc., it is possible to continuously measure the life of the battery and to accurately determine the life of the battery, by way of a simple configuration without increasing the cost.

Furthermore, the storage unit 42 separately manages a value related to charging and a value related to discharging, as information on the number of times charging and discharging. Moreover, when the rechargeable battery 32 is mounted, in a case in which the control unit 101 determines that the stored first voltage information V1 is higher than the second voltage information V2 that is a voltage of the mounted rechargeable battery, the control unit 101 performs correction such that a value related to discharging is added to the information on the number of times charging and discharging. In addition, in a case in which the control unit 101 determines that the second voltage information V2 is higher than the first voltage information V1, the control unit 101 performs control such that a value related to charging is added to the information on the number of times charging and discharging.

With such a configuration, even in a case in which the rechargeable battery has been replaced, etc., it is possible to continuously measure the life of the battery and to determine the life of the battery more accurately, by way of a simple configuration without increasing the cost.

Furthermore, the storage unit 42 stores a weighting value that is different for each voltage value. Moreover, each time charging of the rechargeable battery 32 is started or completed, the control unit 101 extracts a weighting value, which corresponds to a voltage value of the rechargeable battery 32 measured by the voltage measuring unit 100, from the storage unit 42. In addition, the control unit 101 sequentially adds the weighting value thus extracted, and identifies information on the number of times charging and discharging, and when the rechargeable battery 32 is mounted, the control unit 101 compares the first voltage information V1 and the second voltage information V2. Furthermore, in a case in which the values are different from each other, the control unit 101 extracts a weighting value corresponding to the second voltage information V2 from the storage unit 42, and performs correction such that the extracted weighting value is added to the information on the number of times charging and discharging retained in the storage unit 42.

With such a configuration, even in a case in which the rechargeable battery has been replaced, etc., it is possible to continuously measure the life of the battery and to determine the life of the battery more accurately, by way of a simple configuration without increasing the cost.

Moreover, the rechargeable battery 32 has unique ID information. In addition, the storage unit 42 retains the information on the number of times charging and discharging and the first voltage information V1 for each rechargeable battery 32 based on the ID information. Furthermore, when the rechargeable battery 32 is mounted, the control unit 101 confirms ID information of the rechargeable battery 32, and measures a voltage of the rechargeable battery 32 as the second voltage information via the voltage measuring unit 100. Moreover, the control unit 101 searches the storage unit 42 for ID information corresponding to the rechargeable battery 32, and compares the first voltage information V1 corresponding to the searched ID information and the second voltage information V2 of the mounted rechargeable battery 32. In addition, in a case in which the first voltage information V1 and the second voltage information V2 are different from each other, the control unit 101 corrects the information on the number of times charging and discharging corresponding to the searched ID information.

With such a configuration, even in a case in which the rechargeable battery has been replaced, etc., it is possible to continuously measure the life of the battery and to determine the life of the battery more accurately, by way of a simple configuration without increasing the cost.

Next, the aforementioned method of determining the life of a battery is described with reference to the flowchart shown in FIG. 6. It should be noted that the following explanation is made assuming a case in which the rechargeable battery 32 that has been mounted to the cellular telephone device 1 is removed, and is subsequently mounted again.

In Step S1, the control unit 101 performs control such that a battery voltage of the rechargeable battery 32 (first voltage information V1) is measured by the voltage measuring unit 100. It should be noted that the voltage measuring unit 100 periodically checks the battery voltage of the rechargeable battery 32.

In Step S2, the control unit 101 determines whether the rechargeable battery 32 has been removed from the rechargeable-battery housing portion 31C, which is a predetermined location. In a case in which it has been determined that the rechargeable battery 32 has been removed from the rechargeable-battery housing portion 31C (Yes), the processing advances to Step S3, and in a case in which it has been determined that the rechargeable battery 32 remains mounted to the rechargeable-battery housing portion 31C (No), the processing returns to Step S1.

In Step S3, the control unit 101 stores the most recent battery voltage (first voltage information V1) of the rechargeable battery 32 in the storage unit 42 in association with the ID information of the rechargeable battery 32.

In Step S4, the control unit 101 determines whether the rechargeable battery 32 has been mounted to the rechargeable-battery housing portion 31C, which is a predetermined location. In a case in which it has been determined that the rechargeable battery 32 has been mounted to the rechargeable-battery housing portion 31C, the processing advances to Step S5, and in a case in which it has been determined that the rechargeable battery 32 is not mounted to the rechargeable-battery housing portion 31C, the processing repeats Step S4. It should be noted that power supply is not performed in practice while the rechargeable battery 32 is removed; therefore, strictly speaking, instead of repeating Step S4, the processing waits for mounting of the rechargeable battery 32, i.e. an occurrence of power supply to the control block 48. When power supply from the rechargeable battery 32 to the control block 48 is started, the control unit 101 is activated in the background to perform predetermined processing.

In Step S5, the control unit 101 performs control such that a battery voltage of the mounted rechargeable battery 32 (second voltage information V2) is measured by the voltage measuring unit 100.

In Step S6, the control unit 101 reads ID information of the rechargeable battery 32 mounted to the rechargeable-battery housing portion 31C.

In Step S7, based on the ID information that was read in Step S6, the control unit 101 refers to the storage unit 42, and reads information on a battery voltage corresponding to the ID information. It should be noted that, in this step, in a case in which there is no information on a battery voltage corresponding to the ID information as a result of referring to the storage unit 42 based on the ID information that was read in Step S6, i.e. in a case in which the ID information is not registered in the storage unit 42, the series of processing is terminated.

In Step S8, the control unit 101 compares the first voltage information V1 that was stored in the storage unit 42 in Step S3 and the second voltage information V2 that was measured in Step S5.

In Step S9, from the result of the comparison in Step S8, the control unit 101 determines whether the second voltage information V2 is larger than the first voltage information V1, i.e. whether a relationship of "V1<V2" is established. In a case in which it has been determined that the relationship of "V1<V2" is established (Yes), the processing advances to Step S10, and in a case in which it has been determined that the relationship of "V1<V2" is not established (No), the processing advances to Step S11. It should be noted that the establishment of the relationship of "V1<V2" implies that the rechargeable battery 32, which had been removed once, has been charged by another charging device, etc.

In Step S10, the control unit 101 corrects the information on the number of times charging, of the information on the number of times charging and discharging, stored in the storage unit 42. It should be noted that the correction method is performed by factoring in a correction coefficient X. Here, the correction coefficient X is determined as follows, for example:

(second voltage information V2→correction coefficient X),
3.60 V→0 time;
3.80 V→0.1 times;
3.84 V→0.2 times;
3.88 V→0.3 times;
3.92 V→0.4 times;
3.95 V→0.5 times;
3.98 V→0.6 times;
4.02 V→0.7 times;
4.05 V→0.8 times;
4.10 V→0.9 times; and
4.20 V→1.0 time.

In Step S11, from the result of the comparison in Step S8, the control unit 101 determines whether the first voltage information V1 is larger than the second voltage information V2, i.e. whether a relationship of "V1>V2" is established. In a case in which it has been determined that the relationship of "V1>V2" is established (Yes), the processing advances to Step S12, and in a case in which it has been determined that the relationship of "V1>V2" is not established (No), the processing advances to Step S13. It should be noted that the establishment of the relationship of "V1>V2" implies that the rechargeable battery 32, which had been removed once, has been used in another device, or has been discharged due to spontaneous discharging or the like.

In Step S12, the control unit 101 corrects the information on the number of times discharging, of the information on the number of times charging and discharging, stored in the storage unit 42. It should be noted that the correction method is performed by factoring in a correction coefficient Y. Here, the correction coefficient Y is determined as follows, for example:

(second voltage information V2→correction coefficient Y).
4.20 V or higher→0 time;
4.00 V→0.1 times;
3.88 V→0.2 times;
3.83 V→0.3 times;
3.77 V→0.4 times;
3.73 V→0.5 times;
3.69 V→0.6 times;
3.67 V→0.7 times;
3.65 V→0.8 times;
3.60 V→0.9 times; and
3.30 V→1.0 time.

In Step S13, the control unit 101 does not correct the information on the number of times charging and discharging stored in the storage unit 42. This step implies that first voltage information V1 and the second voltage information V2 are approximately equal to each other.

In this way, even in a case in which the rechargeable battery has been replaced, etc., the cellular telephone device 1 according to the present invention appropriately corrects the information on the number of times charging and discharging for each rechargeable battery 32 stored in the storage unit 42, by way of a simple configuration without increasing the cost. Therefore, the life of the battery can be continuously measured, and the life of the battery can be accurately determined.

In the embodiment, although information on the rechargeable battery may be output to a display as well as a sound output unit, it is not limited thereto. Information on the rechargeable battery may be output to an externally connected monitor, and it may be output to a wirelessly connected external display unit via an antenna. In this way, in addition to the display and the sound output unit, an output unit may be an external connection terminal or a radio communication unit, and various forms thereof can be contemplated.

The invention claimed is:

1. A portable electronic device, comprising:
a storage unit;
a voltage measuring unit that measures a voltage of a rechargeable battery; and
a control unit that,
at a first time of a mounting of the rechargeable battery, receives an identification of the rechargeable battery from the rechargeable battery and receives a first voltage information of the rechargeable battery from the voltage measuring unit,
stores an association of the identification of the rechargeable battery with the first voltage information in the storage unit,
determines that the rechargeable battery has been removed,
after determining that the rechargeable battery has been removed, at a subsequent second time of a remounting of the rechargeable battery, if the rechargeable battery has been discharged or charged between the first time and the second time while the rechargeable battery was not mounted to the portable electronic device, correcting a charging information, comprising a number of times of charging and a number of times of discharging, stored in the storage unit by
receiving the identification of the rechargeable battery from the rechargeable battery,
receiving a second voltage information of the rechargeable battery from the voltage measuring unit,
retrieving the first voltage information from the storage unit based on the association of the identification of the rechargeable battery with the first voltage information,
comparing the first voltage information and the second voltage information,
if the second voltage information is higher than the first voltage information, retrieving a first weighting value corresponding to the second voltage information from the storage unit, and adding the first weighting value to the number of times of charging, wherein the storage unit stores a first weighting value for each of a plurality of second voltage informations, and,
if the first voltage information is higher than the second voltage information, retrieving a second weighting value corresponding to the second voltage information from the storage unit, and adding the second weighting value to the number of times of discharging, wherein the storage unit stores a second weighting value for each of a plurality of second voltage informations.

2. The portable electronic device according to claim 1, wherein the control unit measures, each time charging of the rechargeable battery is completed, a voltage of the rechargeable battery via the voltage measuring unit.

3. The portable electronic device according to claim 2, wherein the control unit measures, each time charging of the rechargeable battery is started, a voltage of the rechargeable battery via the voltage measuring unit.

4. The portable electronic device according to claim 1, wherein the control unit stores an association of the identification of the rechargeable battery with the charging information in the storage unit.

5. The portable electronic device according to claim 1, wherein the control unit stores charging information for each of a plurality of rechargeable batteries based on unique identification information for each of the plurality of rechargeable batteries.

6. The portable electronic device according to claim 5, wherein, when any one of the plurality of rechargeable batteries is mounted, the control unit:
receives the unique identification information for the rechargeable battery;
searches the storage unit based on the unique identification information for the rechargeable battery to retrieve first voltage information for the rechargeable battery associated with the unique identification information for the rechargeable battery;
receives second voltage information from the rechargeable battery;
compares the retrieved first voltage information to the received second voltage information; and
if the retrieved first voltage information is different than the received second voltage information, corrects the stored charging information for the rechargeable battery.

7. The portable electronic device according to claim 1, wherein the control unit outputs information on a life of the rechargeable battery, while mounted, based on the charging information.

8. The portable electronic device according to claim 7, wherein the storage unit stores a predetermined value for indicating that the life of the rechargeable battery has reached an end, and wherein the information on the life of the rechargeable battery is based on a comparison of the charging information to the predetermined value.

9. The portable electronic device according to claim 8, wherein the information on the life of the rechargeable battery comprises a remaining number of times for which charging is possible.

10. The portable electronic device according to claim 8, wherein the comparison of the charging information to the predetermined value comprises a difference between the predetermined value and the charging information.

11. A method of controlling a portable electronic device in which a rechargeable battery can be mounted thereto and removed therefrom, and which includes a storage unit configured so as to retain at least a part of information stored even if the rechargeable battery is removed, the method comprising the steps of, by a central processing unit of the portable electronic device:
  at a first time of a mounting of a rechargeable battery to the portable electronic device, receiving an identification of the rechargeable battery from the rechargeable battery and receiving a first voltage of the rechargeable battery;
  storing an association of the identification of the rechargeable battery with the first voltage in the storage unit; and,
  at a subsequent second time of a remounting of the rechargeable battery to the portable electronic device, if the rechargeable battery has been discharged or charged between the first time and the second time while the rechargeable battery was not mounted to the portable electronic device, correcting a charging information, comprising a number of times of discharging or a number of times of charging, stored in the storage unit by
    receiving the identification of the rechargeable battery from the rechargeable battery,
    receiving a second voltage of the rechargeable battery,
    retrieving the first voltage from the storage unit based on the association of the identification of the rechargeable battery with the first voltage,
    comparing the first voltage and the second voltage,
    if the first voltage is greater than the second voltage, retrieving a first weighting value corresponding to the second voltage from the storage unit, and adding the first weighting value to the number of times of discharging, wherein the storage unit stores a first weighting value for each of a plurality of second voltage informations, and,
    if the first voltage is less than the second voltage, retrieving a second weighting value corresponding to the second voltage from the storage unit, and adding the second weighting value to the number of times of charging, wherein the storage unit stores a second weighting value for each of a plurality of second voltage informations.

12. The method of claim 11, further comprising determining a remaining life of the rechargeable battery based on a difference between the charging information and a predetermined value stored in the storage unit.

13. The method of claim 11, further comprising detecting a removal of the rechargeable battery from the portable electronic device, wherein the first voltage is a most recent voltage received for the rechargeable battery, and wherein storing an association of the identification of the rechargeable battery with the first voltage in the storage unit comprises, in response to the detection of the removal of the rechargeable battery, storing an association of the identification of the rechargeable battery with the most recent voltage received for the rechargeable battery in the storage unit.

14. The method of claim 11, wherein receiving the identification of the rechargeable battery from the rechargeable battery comprises:
  by the portable electronic device, generating operating power in the rechargeable battery using electromagnetic induction; and
  by a contact-less reader of the portable electronic device, sending a request for the identification of the rechargeable battery, and, in response to the request, receiving the identification of the rechargeable battery from a contact-less output unit of the rechargeable battery.

* * * * *